United States Patent
Wu et al.

[11] Patent Number: 5,347,161
[45] Date of Patent: Sep. 13, 1994

[54] STACKED-LAYER STRUCTURE POLYSILICON EMITTER CONTACTED P-N JUNCTION DIODE

[75] Inventors: Shye-Lin Wu, Nan-Tou; Chung-Len Lee; Tan-Fu Lei, both of Hsinchu, all of Taiwan

[73] Assignee: National Science Council, Taipei, Taiwan

[21] Appl. No.: 939,244

[22] Filed: Sep. 2, 1992

[51] Int. Cl.$^5$ ............... H01L 23/48; H01L 29/46
[52] U.S. Cl. ..................... 257/756; 257/750; 257/754
[58] Field of Search ........... 257/497, 603, 604, 605, 257/606, 52, 754, 756, 750

[56] References Cited

U.S. PATENT DOCUMENTS

| | | | |
|---|---|---|---|
| 4,752,813 | 6/1988 | Bhatia et al. | 257/486 |
| 4,994,873 | 2/1991 | Madan | 257/315 |
| 5,057,899 | 10/1991 | Samata et al. | 257/754 |
| 5,109,256 | 4/1992 | De Long | 257/281 |

*Primary Examiner*—Rolf Hille
*Assistant Examiner*—Minhloan Tran
*Attorney, Agent, or Firm*—Townsend and Townsend Khourie and Crew

[57] ABSTRACT

A process is used to fabricate diodes having an emitter contacted p-n junction. A stack of n$^+$-type polysilicon layers are formed one upon the other upon a p-type silicon substrate. In an accordingly fabricated diode, native oxide layers that forms between the n$^+$-type polysilicon layer and the p-type substrate would be liable to be broken up, and thicker epitaxial layer would be formed between the same. The p-n junction is with a thickness of 0.05–0.2 μm. As the diode is reverse-biased, for example at −5V, leakage current could be less than 1 nÅ/cm$^2$. The reverse-bias breakdown voltage could be larger than −100 V. When forward-biased, the ideality factor of the diode is close to unity.

4 Claims, 13 Drawing Sheets

STACKED-LAYER STRUCTURE POLYSILICON EMITTER CONTACTED P-N JUNCTION DIODE

BACKGROUND OF THE INVENTION

1. Field of the Invention

The present invention relates generally to a stacked-layer structure polysilicon emitter contacted diode fabrication processes, and more specifically, to a polysilicon emitter diode formed by a stacked-amorphous-silicon film (SAS) or a stacked-polycrystalline-silicon film (SPS).

2. Background of the Invention

Figure 1:
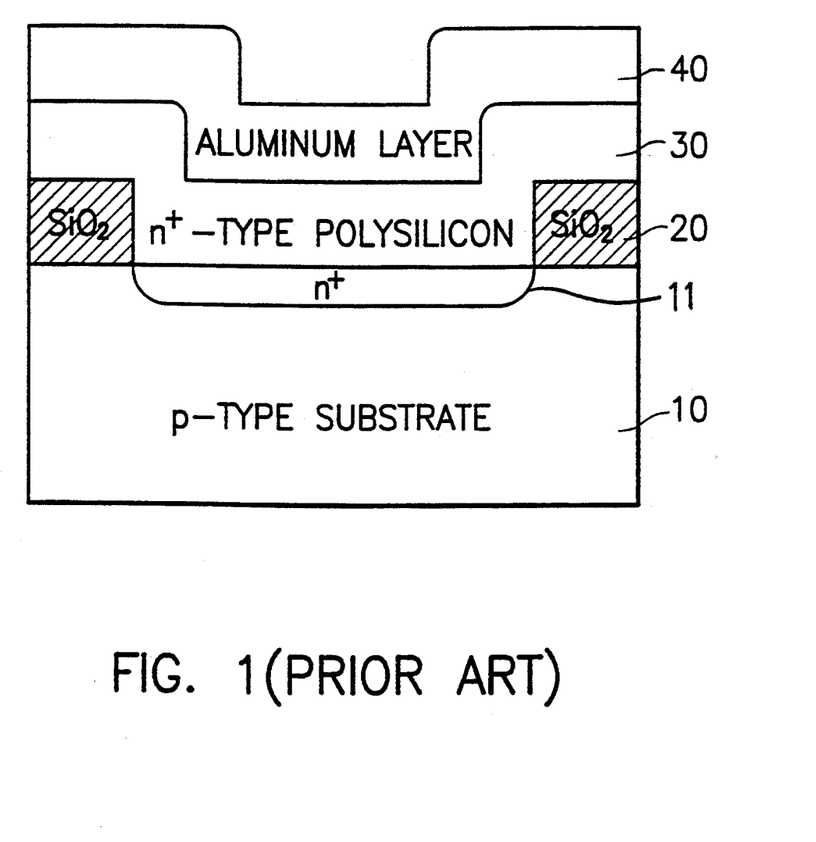
FIG. 1 is a cross sectional view of a conventional emitter contacted p-n junction diode.

A conventional diode having a shallow polysilicon emitter contacted p-n junction is shown in FIG. 1. The conventional diode will be hereinafter referred to as an as-deposited poly-Si (ADP) diode, which includes a p-type substrate of silicon 10, a single layer of heavily doped n+-type polysilicon 30, and an aluminum layer 40 used as the electrode. Between the n+-type polysilicon layer 30 and the p-type silicon substrate 10 is there formed a n+-p junction 11, which has a shallow depth of about 0.2 $\mu$m. Since the n+-p junction 11 is buried into the p-type substrate 10, it is customarily termed as "an polysilicon emitter contacted p-n junction".

The process for fabricating the conventional ADP diode of FIG. 1 includes in general a first step of depositing a layer of pure polysilicon upon the p-type substrate 10 and a second step of implanting donor impurities such as arsenic ions or phosphorus ions onto the pure polysilicon layer to form the n+-type polysilicon layer 30 and a final step of forming the aluminum layer 40. At the second step, the ion implantation process is controlled in such a manner that donor ions penetrate the p-type substrate 10 and whereby a shallow n+-p junction is formed. The implantation is controlled in such a manner that the donor ions diffuse to a predetermined extent, i.e. the depth of the n+-p junction, into the p-type substrate.

The drawback of the conventional ADP diode of FIG. 1 is that undesired thin layer of native oxide formed between the n+-type polysilicon layer 30 and the p-type substrate 10 is difficult to break up completely. As a consequence, there is caused a nonuniform junction and an unstable electrical characteristics of the polysilicon emitter contacted device.

SUMMARY OF THE INVENTION

It is therefore a primary object of the present invention to provide a process for fabricating diodes in which native oxide layers break up easily.

It is another object of the present invention to provide a process for fabricating diodes in which a thicker epitaxial layer would be formed between the polysilicon layer and the substrate.

It is still another object of the present invention to provide a process for fabricating diodes in which the p-n junction has a shallower depth.

It is a further object of the present invention to provide a process for fabricating diodes having better electrical characteristics.

In accordance with the foregoing and other objects of the present invention, there is provided an emitter contacted p-n junction diode in which the n+-type semiconductor region is formed by depositing a stack of three thinner polysilicon layers respectively. In such a diode, native oxide layers formed between the n+-type polysilicon layer and the p-type substrate break up easily and thicker epitaxial layer would be formed, typically with a thickness of 260 Å. For an n+-p diode formed with six stacked layers of n+-polysilicon, the maximum thickness of epitaxial layer could be as large as 760 Å. The p-n junction depth is about 0.05–0.2 $\mu$m. As the diode is reverse-biased, for example at 5 Volt, leakage current can be less than 1 nA/cm$^2$. The reversebias breakdown voltage can be larger than 100 Volt. The forward-biased ideality factor of the diode is close to unity.

BRIEF DESCRIPTION OF THE DRAWINGS

The present invention can be more fully understood by reading the subsequent detailed description of the preferred embodiments thereof with references made to the accompanying drawings, wherein:

FIGS. 3A–3B are graphical representations, in which

FIGS. 5A–5C are graphs of I-V characteristics for the SAS diode according to the present invention and the prior art ADP diode, in which FIG. 5A shows that when the diodes are forward biased; and FIGS. 5B–5C show that when the diodes are reverse biased;

DETAILED DESCRIPTION OF THE PREFERRED EMBODIMENTS

A disclosure of the embodied diode according to the present invention has been published previously in the following technical papers:

(1) "*High-Performance Polysilicon Contacted Shallow Junctions Formed by Stacked-Amorphous-Silicon Films*" published in *IEEE ELECTRON DEVICE LETTERS*, Vol. 13, No. 1, pp. 23–25, January 1992; and (2) "*Investigation on the Interface of the Polycrystalline Silicon Contacted Diode Formed with a Stacked Amorphous Silicon Film*", published in IEEE Transactions on *JOURNAL OF ELECTRONIC MATERIALS*, Vol. 21, No. 8, pp.811–816, August 1992.

An exemplary process for fabricating the diode according to the present invention will be described hereinunder step by step.

Figure 2A:
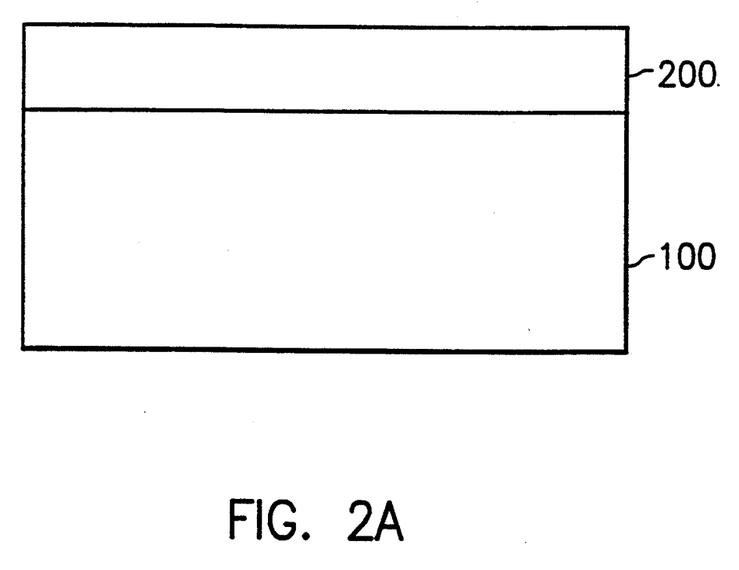
FIGS. 2A–E show the procedural steps involved in fabricating an emitter contacted p-n junction diode according to the present invention.

STEP 1: (FIG. 2A)

A substrate 100 upon which all integrated components will be fabricated is prepared by using a wafer of p-type silicon having a resistivity of 4–11.5 $\Omega$cm. The substrate 100 is subsequently thermally oxidized at a temperature of 1100° C. to grow a field oxide layer 200 having a thickness of about 6000 Å.

The wafer may be doped by $BF_2$ ion implantation at 50 KeV with a dose of $5 \times 10^{13}$ cm$^{-2}$, simulating the base doping level of a bipolar transistor. The wafer is dipped in an $HF:H_2O$ (1:50) solution to remove the surface native oxide thereof.

STEP 2: ( FIG. 2B )

Figure 2B:
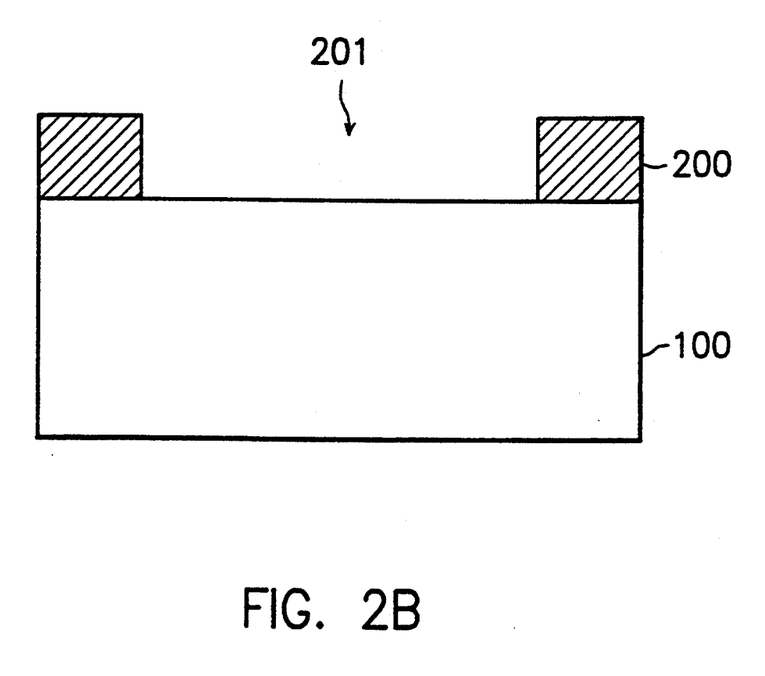

A standard photolithographic process is used in this step to define active regions, by which an opening 201 through the $SiO_2$ layer 200 is formed. The steps involved in the photolithographic process are conventional techniques so that details thereof will not be described.

Figure 2C:
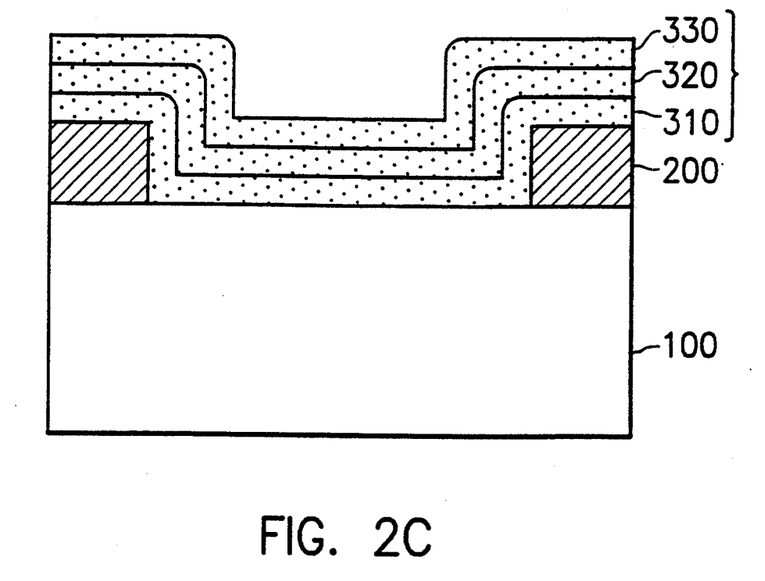

STEP 3: (FIG. 2C)

In this exemplary example, a stack of three layers of n+-type polysilicon will be formed upon the p-type substrate 100. It is to be understood that there should be formed at least two n+-type polysilicon layers and it is within the scope and spirit of the present invention if more than three n+-type polysilicon layers are formed. For a best mode embodiment of the present invention, it is disclosed that three n+-type polysilicon layers are formed.

An LPCVD system (low-pressure chemical vapor deposition) is used to deposit each pure polysilicon layers a temperature of 625° C., and a growth rate controlled at 110 Å/min (Angstroms per minute). If amorphous silicon material is used, the LPCVD deposits each amorphous silicon layer under the conditions of a $SiH_4$ pressure of 140 mtorr and a temperature of 550° C.

A first layer of pure polysilicon layer 310 is deposited to a thickness of about 500 Å to 1000 Å, preferably 1000 Å. During the deposition process, the chamber of the LPCVD system is not interrupted. After the first pure polysilicon layer 310 is completely formed, the LPCVD system removes the $SiH_4$ gas out of the chamber and refills the chamber with nitrogen gas having a pressure of 760 torr (atmospheric pressure). The supply of the nitrogen gas is maintained for about a period of 10 minutes.

Subsequently in this step, a second layer of pure polysilicon 320, and a third layer of pure polysilicon 330 are formed respectively one upon the other, each being formed by the same manner as that for the forming of the first pure polysilicon layer 310. Since each of the three pure polysilicon layers 310, 320, 330 are formed with a same thickness of about 1000 Å, the total thickness of the stacked polysilicon layers is about 3000 Å. As the next pure polysilicon layer is to be deposited, the nitrogen gas is removed out of the chamber and the $SiH_4$ gas is again re-supplied into the same.

STEP 4: ( FIG. 2D )

Figure 2D:
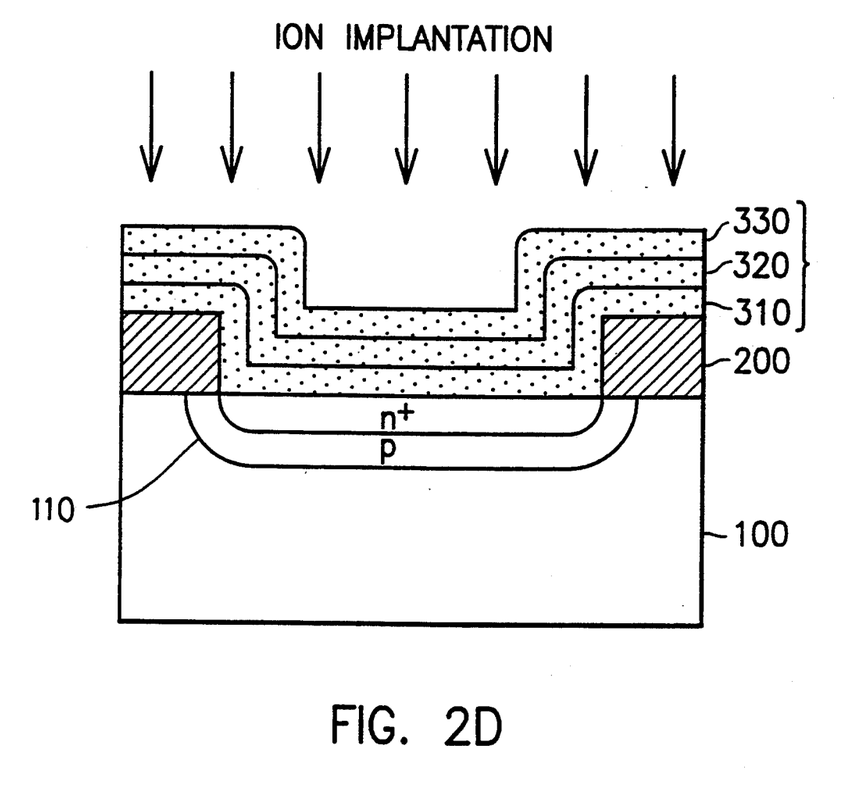

An ion implantation process is used in this step to dope donor impurity ions, such as arsenic ions As+ or phosphorus ions P+, heavily with a dose of at least $5 \times 10^{15}$ cm$^{-2}$, preferably $1 \times 10^{16}$ cm$^{-2}$, into the pure polysilicon layers 310, 320, 330. By the foregoing Step 4, a boundary is formed between two adjacent polysilicon layers, i.e. between 310 and 320, and between 320 and 330. The boundary can be used as a barrier to prevent fast diffusion of the doping impurity ions. This results in a shallower junction in the single crystal silicon. Also these boundaries can segregate the impurity ions that create potential barriers to retard the minority injection from the base. When this diode is used in a bipolar transistor as the emitter-base junction, the injection efficiency of the transistor can be increased to enhance the transistor gain.

As a result of the doping, the pure polysilicon layers 310, 320, 330, are transformed into n+-type polysilicon layers having a donor concentration of $N_D = 10^{20}$ cm$^{-3}$. The doped polysilicon layers are now designated by the new reference numerals "310a", "320a", and "330a". The ion implantation process is controlled in such a manner that impurity ions penetrate the substrate 100 to a depth of about 0.05 μm to 0.2 μm.

Figure 2E:
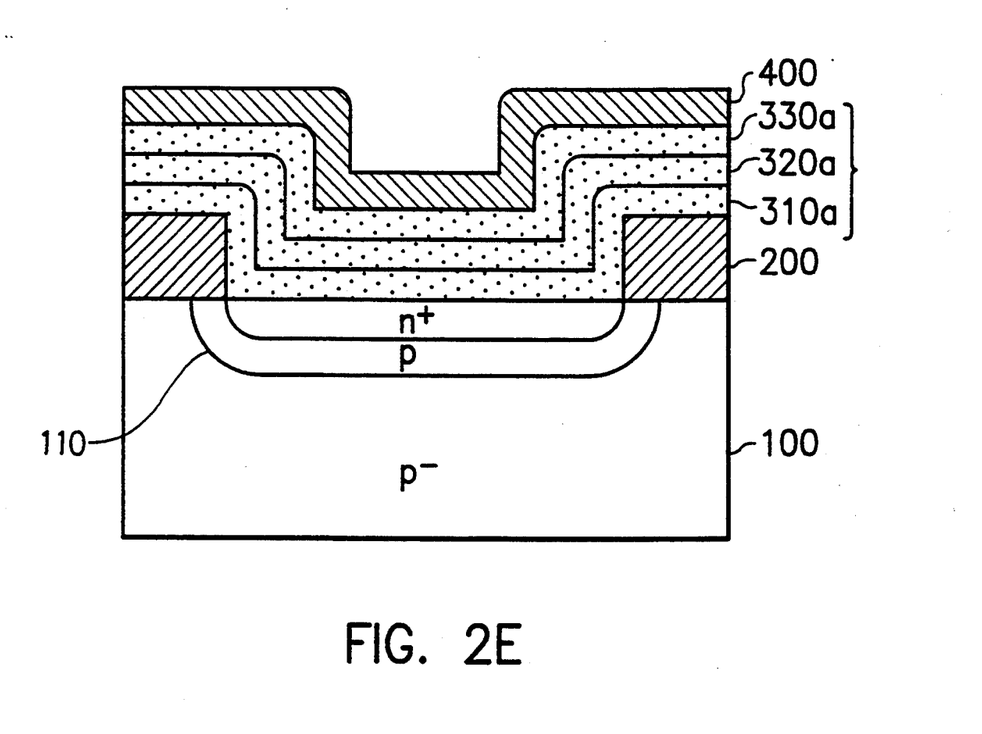

STEP 5: (FIG. 2E)

Finally, a layer of aluminum 400 is deposited upon the third n+-type polysilicon layer 330a by using an evaporation process to a thickness of about 1 μm. The aluminum layer 400 is used as an electrode of the thus fabricated diode. After this, a furnace filled nitrogen gas is used to sintered the diode at a temperature of 400° C. for a duration of 30 minutes.

In another embodiment, an n-type substrate can be used and an ion implantation of acceptor impurities is used to form stacked p-type polysilicon layers.

PERFORMANCE TESTING OF THE DIODE

Figure 3A:
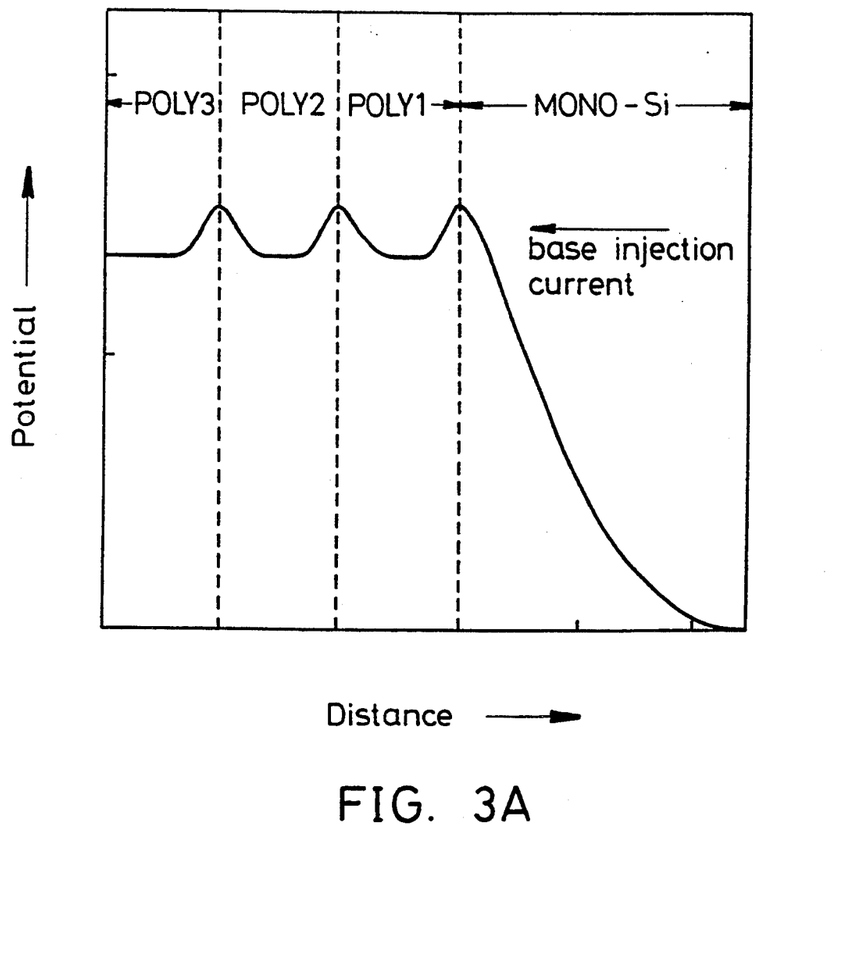
FIG. 3A shows the potential distribution within the SAS emitter region.
Figure 3B:
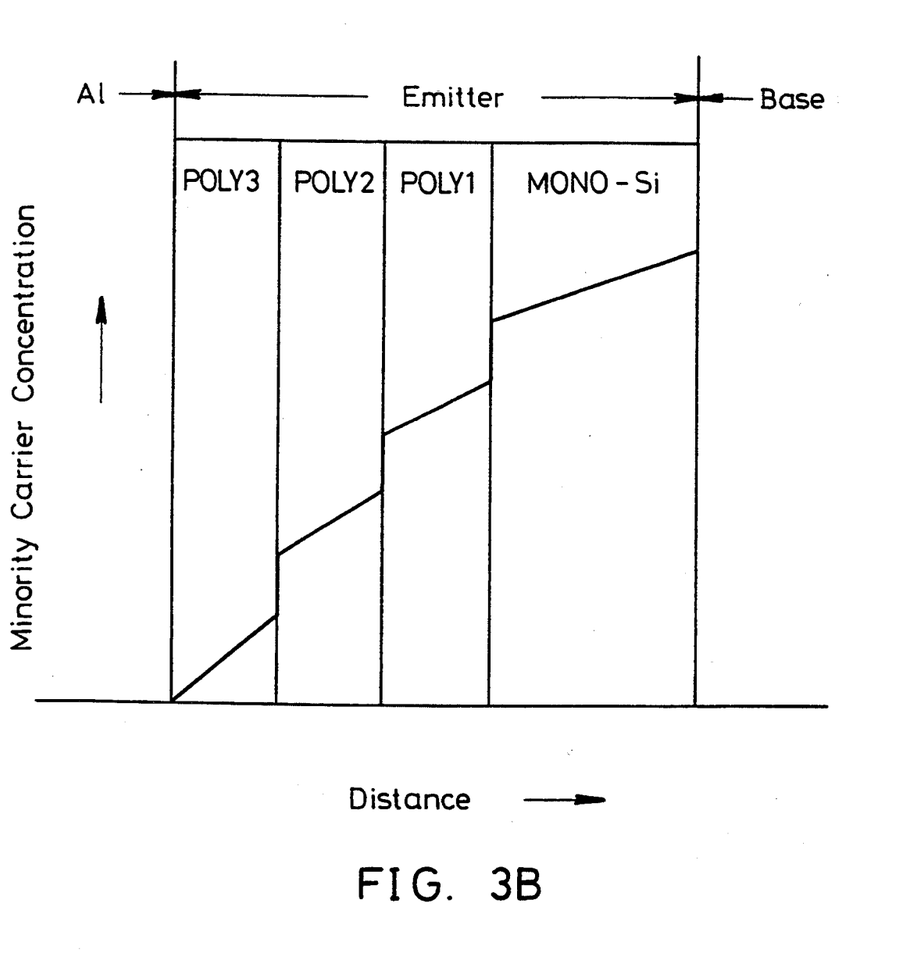
FIG. 3B shows the minority carrier concentration distribution within the SAS emitter region.

The accordingly fabricated diode will be hereinafter referred to as a stacked-amorphous-silicon (SAS) diode. The potential distribution within the SAS emitter region is shown in FIG. 3A, while the minority carrier concentration distribution within the same is shown in FIG. 3B. The segregation atoms create potential barriers that regard the minority carriers injected from the base into the poly-Si emitter region.

An HRTEM (high-resolution transmission electronic microscope) is used to examine the junction 110 between the first n+-type polysilicon layer 310a and the p-type substrate 100 of the diode of FIG. 2E. The photographed pictures show that native oxide layer is partially broken up and an epitaxial layer as thick as 260 Å is formed. This represents a great improvement over the conventional ADP diode of FIG. 1.

Figure 4:
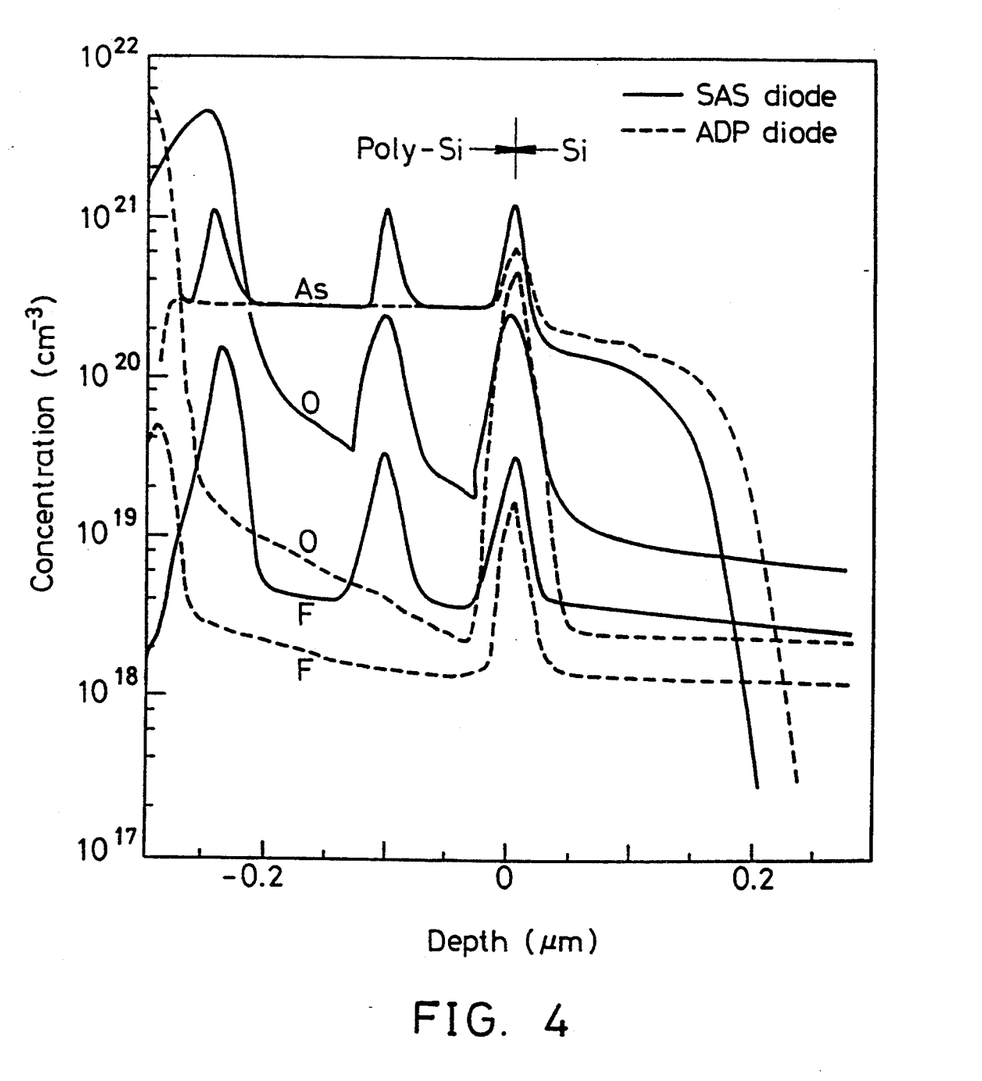
FIG. 4 is a graph of SIMS profiles of implanted arsenic, oxygen, and fluorine for the three-layer SAS diode according to the present invention and the prior art ADP diode.

An SIMS diagram showing the profiles of arsenic, oxygen, and fluorine in the emitter region of the SAS diode (solid line) and the conventional ADP diode (dashed line) is shown in FIG. 4. It can be seen from the plots that three arsenic segregation peaks are present in the SAS diode, while only one peak is observed for the ADP diode. Furthermore, the junction depth of the SAS diode is about 300Å shallower than that of the ADP diode. The shallower depth of the SAS diode is due to the boundaries between adjacent polysilicon layers which provide not only a segregation sink but also serve as a barrier to retard the diffusion of implanted arsenic ions. The arsenic, oxygen and fluorine ions are expected to saturate the boundary dangling bonds and improve the boundary surface states and the minority carrier lifetime.

Figure 5A:
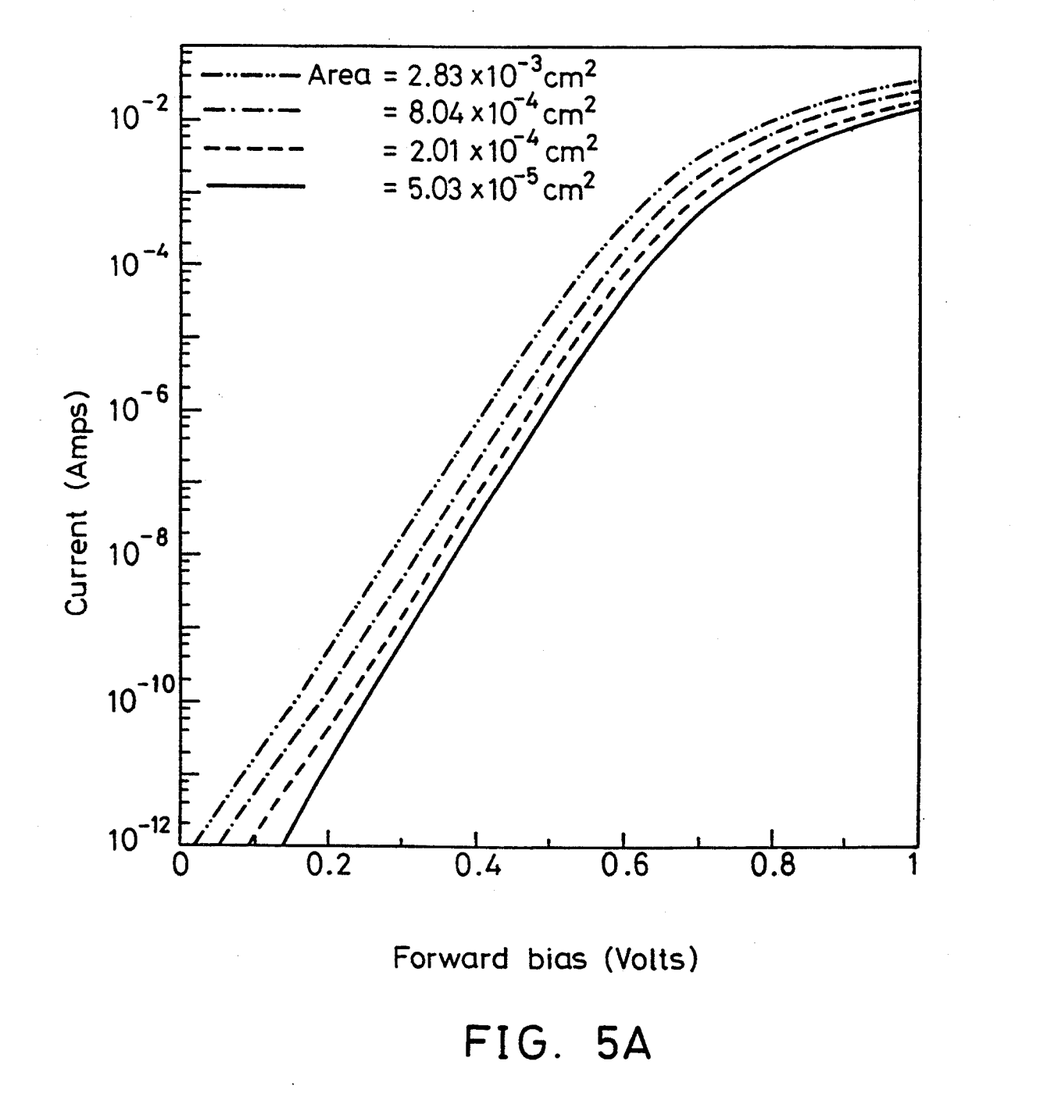
Figure 5B:
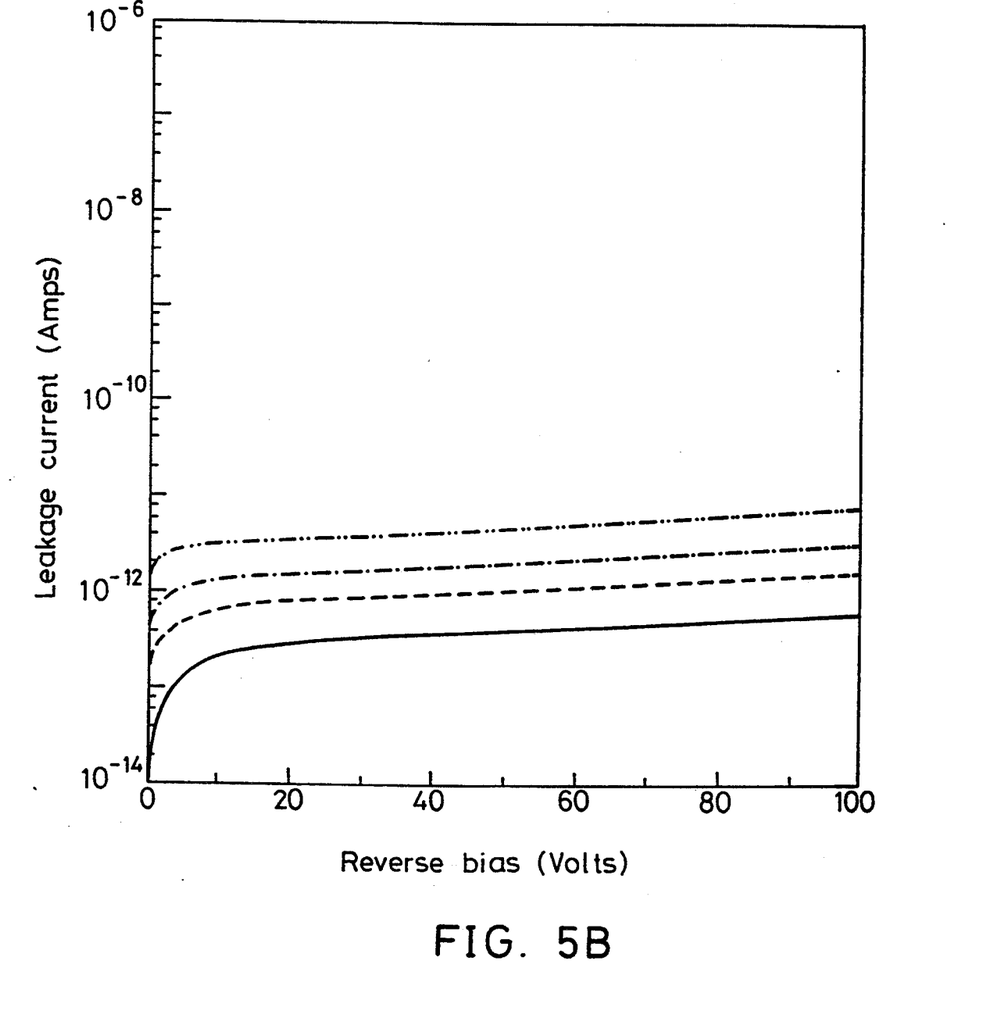

In electrical characteristics test, a plot of forward current versus forward bias voltage for the SAS diode is shown in FIG. 5A; and a plot of leakage current versus reverse bias voltage are shown in FIG. 5B. When a reverse-biased voltage of 5 V is applied to the SAS diode of FIG. 2E, it is found that the leakage current density is less than 1 nÅ/cm$^2$. It is further found that the breakdown limit of a reverse-bias voltage is larger than 100 V. Furthermore, the ideality factor of the SAS diode of FIG. 2E is very close to unity when forward-biased.

Listed in Table 1 are the measured data of the saturation current $I_s$, the ideality factor m, the effective interfacial resistance $R_{int}$ at 0.65 V, and the reverse leakage current density $J_R$ at $-5$ V of the diode of the present invention and the prior art diode.

TABLE 1

|  | $I_s$ (fA) | m | $R_{int}$ (Ω) | $J_R$ (nA/cm$^2$) |
|---|---|---|---|---|
| diode area: $2.83 \times 10^{-3}$ (cm$^2$) | | | | |
| diode of the present invention | 309 | 1.041 | 32.0 | 0.65 |
| prior art diode | 355 | 1.043 | 38.6 | 2.85 |
| diode area: $2.01 \times 10^{-4}$ (cm$^2$) | | | | |
| diode of the present invention | 17.4 | 1.016 | 73.8 | 0.85 |
| prior art diode | 35.5 | 1.036 | 94.5 | 4.88 |

Figure 5C:
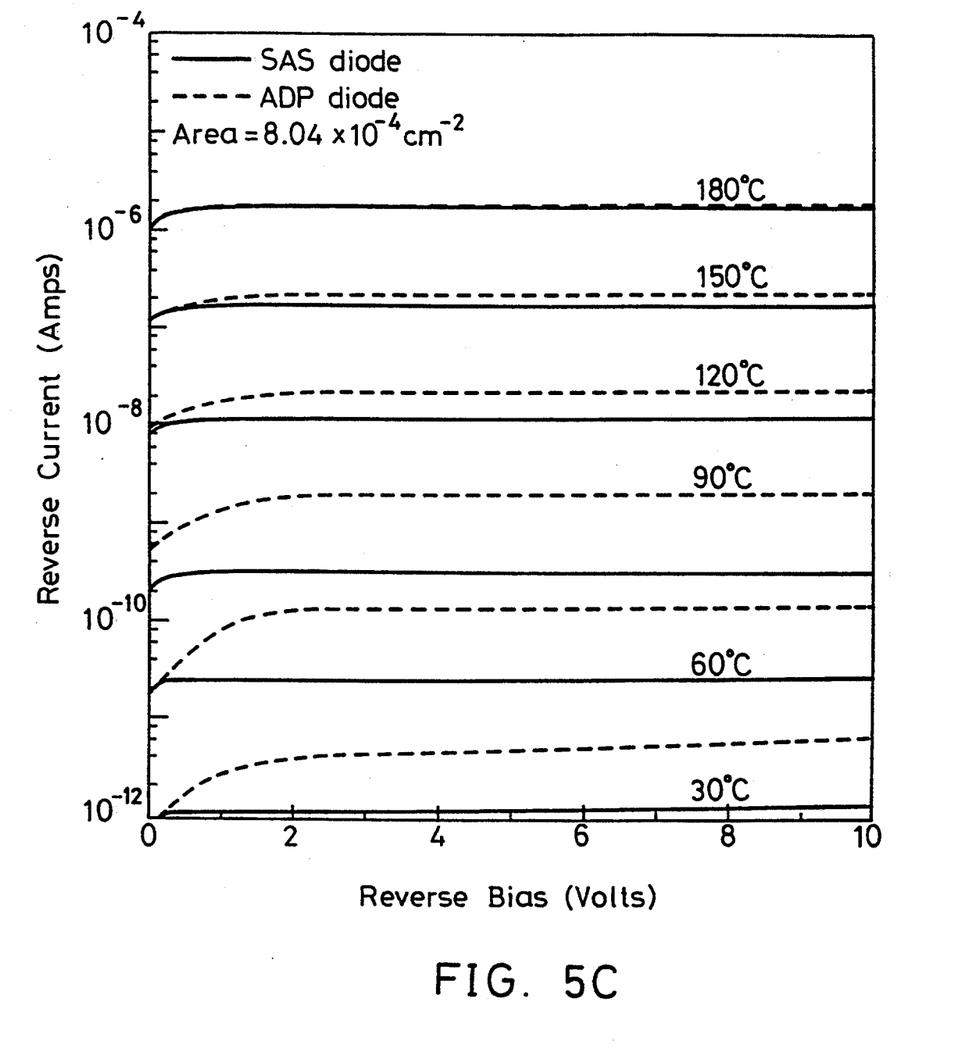

FIG. 5C shows a graph of reverse current versus reverse bias for the SAS diode and the ADP diode under different temperatures. It can be seen from the plots that the SAS diode has a lower magnitude of leakage current, particularly under lower temperature.

Figure 6:
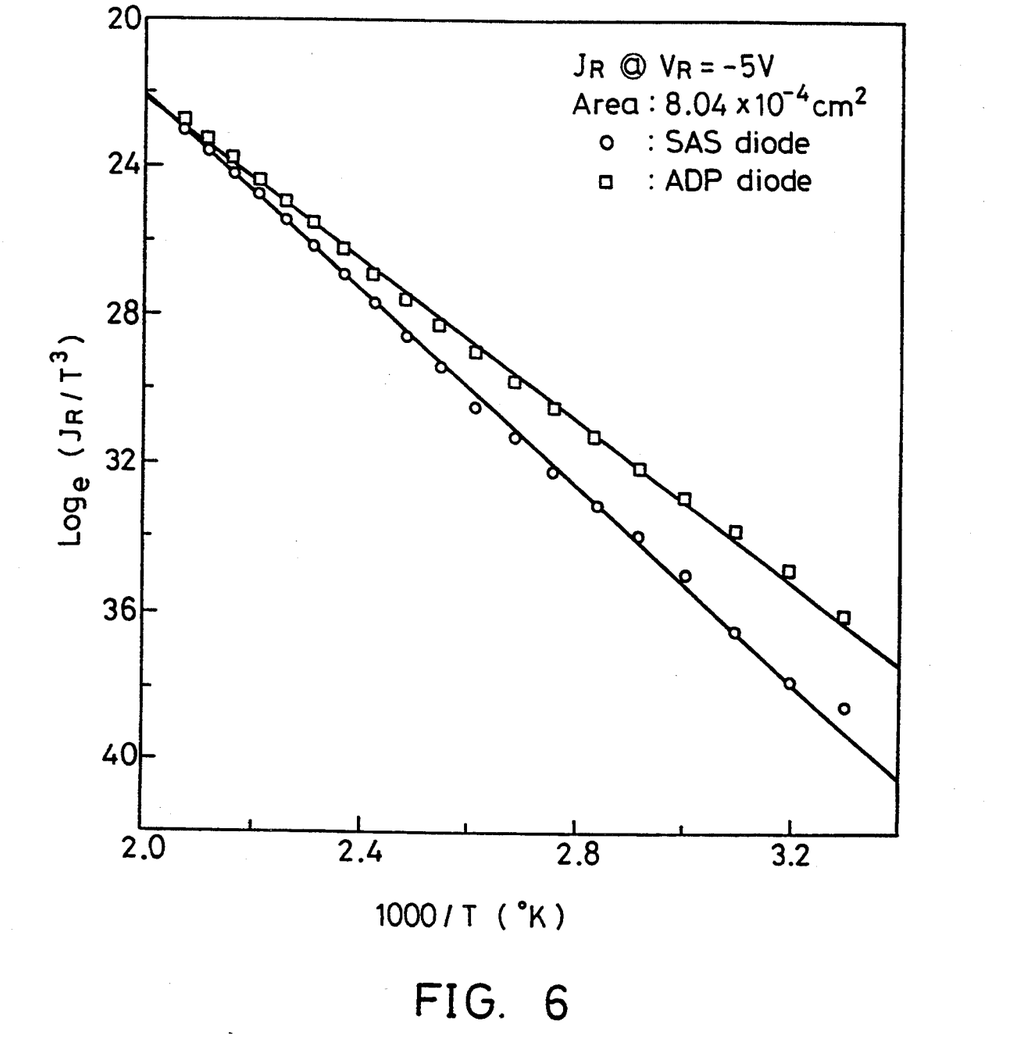
FIG. 6 is a graph of Arrhenius plots for the SAS diode according to the present invention and the prior art ADP diode.

FIG. 6 shows the Arrhenius plots of $\log_e(J_R/T^3)$ versus 1/T for respectively the SAS diode and the ADP diode, where $J_R$ is the reverse current density and T is the temperature. The reverse current density is measured with a reverse voltage of 5 V applied to both of the diodes. Deriving from the plots, the activation energy $E_g$(eff) of the SAS diode is 1,132 eV, and that of the ADP diode is 0.937 eV. This implies that the reverse leakage current of the SAS diode is contributed almost entirely by the diffusion current outside the junction depletion region. For the ADP diode, the generation current in the depletion region and/or at the junction peripheral region plays somewhat an important role in contributing the reverse current.

Figure 7A:
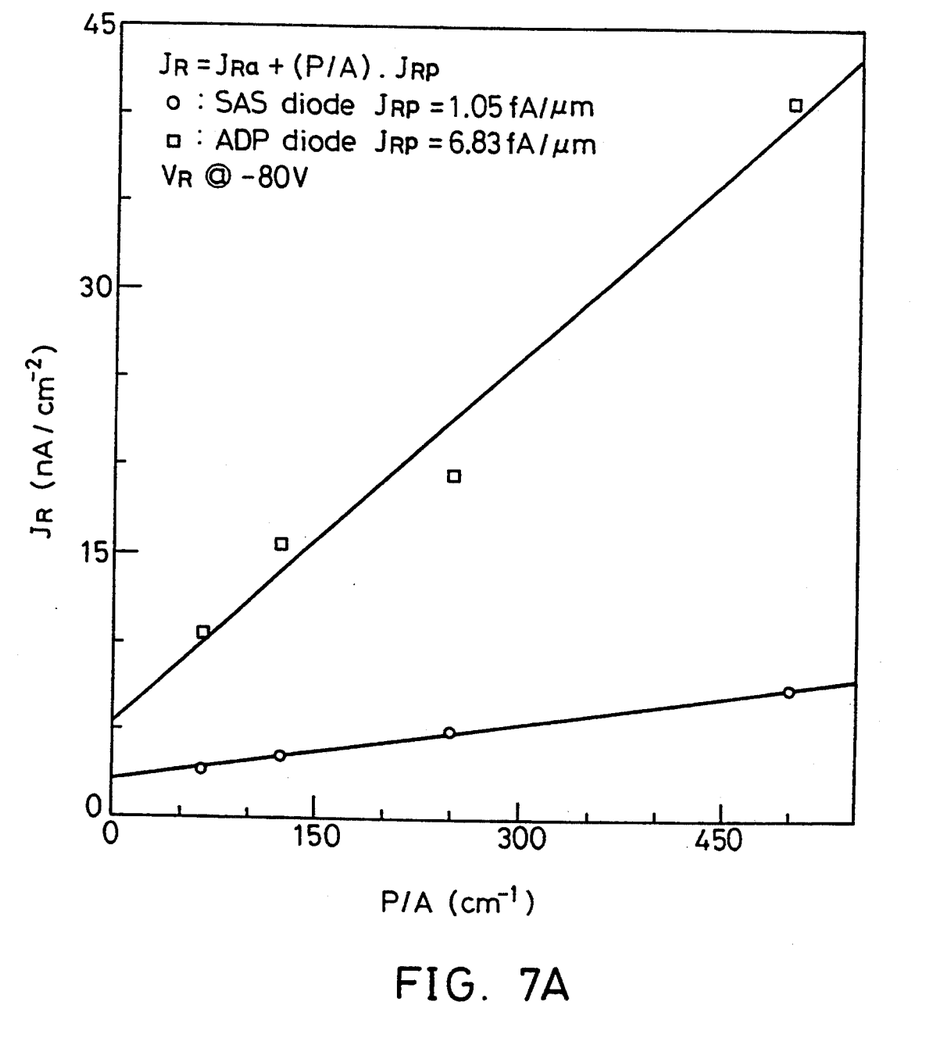
FIGS. 7A–7B are graphs, showing the current density characteristics of the SAS diode according to the present invention and the prior art ADP diode.

FIG. 7A is a graph showing plots of $J_R$ versus P/A, where $J_R$ is the leakage current density, P/A is the perimeter-to-area ratio of circular areas through which the leakage current passes. It can be seen from FIG. 7A that the slope of the plot corresponding to the SAS diode is much smaller than that of the plot corresponding to the ADP diode, indicating that in the SAS diode the periphery generation current contributes only a small portion to the total leakage current.

Figure 7B:
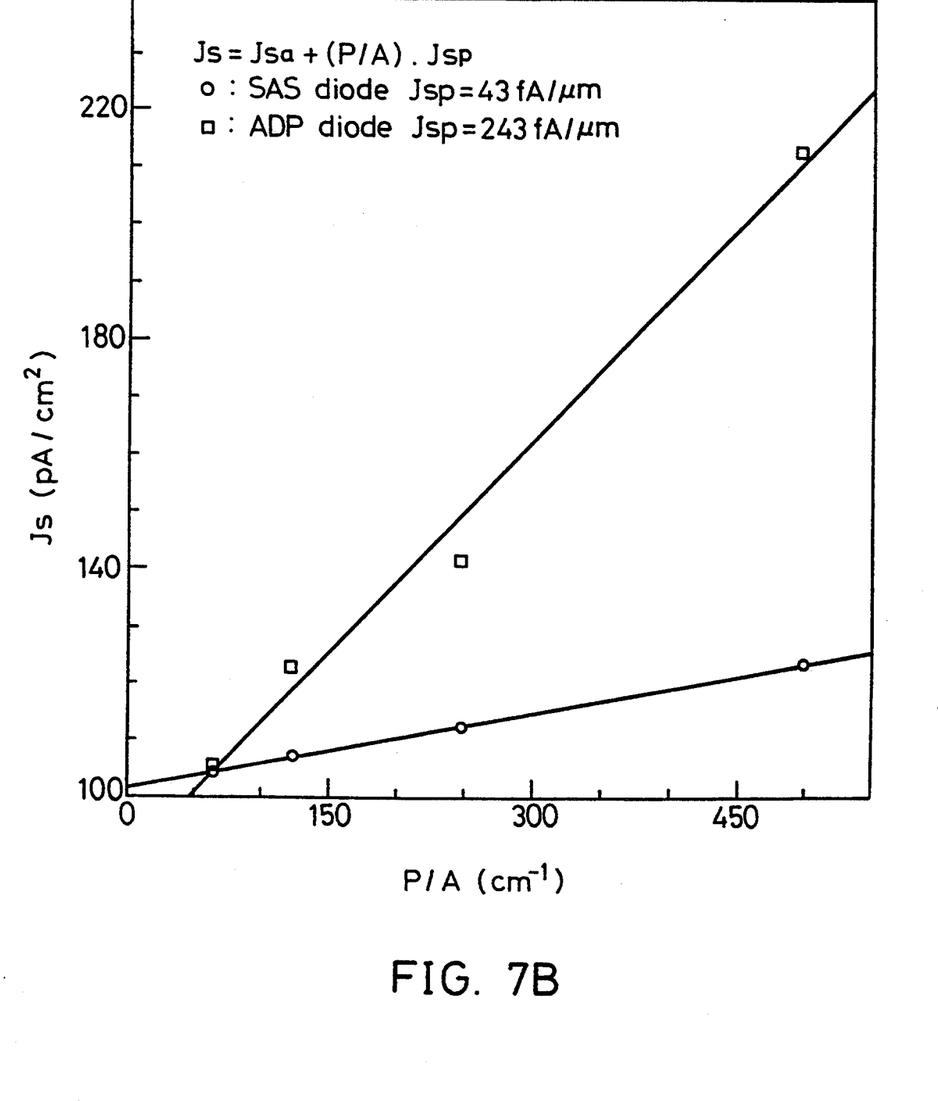

FIG. 7B is a graph showing plots of $J_S$ versus P/A, where $J_S$ is the forward saturation current. It can be seen from FIG. 7B that the slope of the plot corresponding to the SAS diode is also much smaller than that of the plot corresponding to the ADP diode The p-n junction structure described above can be used not only directly as a diode, but it can be employed in constructing bipolar transistors or CMOS having a p-n-p or n-p-n configuration. The present invention has been described hitherto with exemplary preferred embodiments. However, it is to be understood that the scope of the present invention need not be limited to the disclosed preferred embodiment. On the contrary, it is intended to cover various modifications and similar arrangements within the scope defined in the following appended claims. The scope of the claims should be accorded the broadest interpretation so as to encompass all such modifications and similar arrangements.

What is claimed is:
1. A p-n junction diode, comprising:
   (a) a substrate of p-type semiconductor;
   (b) a stack of at least two layers of N+-type polysilicon formed upon said substrate; and
   (c) an electrode disposed over said stack of at least two n+-type polysilicon layers;

wherein each of said n+-type polysilicon layers has a thickness in the range from 500 Å to 1000 Å and a donor concentration of at least $10^{20}$ cm$^{-3}$.

2. A p-n junction diode, comprising:
   (a) a substrate of p-type semiconductor;
   (b) a stack of at least three layers of n+-type polysilicon formed upon said substrate; and
   (c) an electrode disposed over said stack of at least three n+-type polysilicon layers 3. A p-n junction diode, comprising:
   (a) a substrate of n-type semiconductor;
   (b) a stack of at least two layers of p+-type polysilicon formed upon said substrate; and
   (c) an electrode disposed over said stack of at least two p+-type polysilicon layers;

wherein each of said p+-type polysilicon layers has a thickness in the range from 500 Å to 1000 Å and a donor concentration of at least $10^{20}$ cm$^{-3}$.

4. A p-n junction diode, comprising:
   (a) a substrate of n-type semiconductor;
   (b) a stack of at least three layers of p+-type polysilicon formed upon said substrate; and
   (c) an electrode disposed over said stack of at least three p+-type polysilicon layers

* * * * *